US007711135B2

(12) United States Patent
Tsutsumi

(10) Patent No.: US 7,711,135 B2
(45) Date of Patent: May 4, 2010

(54) SOUNDING DEVICE

(76) Inventor: Teruo Tsutsumi, Room 310, Meguro Eru Arukasaru 3-22, Shimomeguro 1-chome, Meguro-ku, Tokyo 153-0064 (JP)

( * ) Notice: Subject to any disclaimer, the term of this patent is extended or adjusted under 35 U.S.C. 154(b) by 755 days.

(21) Appl. No.: 10/509,273

(22) PCT Filed: Apr. 30, 2002

(86) PCT No.: PCT/JP02/04326

§ 371 (c)(1), (2), (4) Date: Aug. 8, 2005

(87) PCT Pub. No.: WO03/084286

PCT Pub. Date: Oct. 9, 2003

(65) Prior Publication Data

US 2006/0023910 A1 Feb. 2, 2006

(30) Foreign Application Priority Data

Mar. 29, 2002 (JP) ............................ 2002-095685

(51) Int. Cl.
*H04R 1/02* (2006.01)
*H04R 25/00* (2006.01)
*H04R 7/00* (2006.01)
*H05K 5/00* (2006.01)
*A47B 81/06* (2006.01)

(52) U.S. Cl. ....................... 381/345; 381/160; 381/346; 381/349; 381/350; 381/353; 181/155; 181/156; 181/158; 181/199

(58) Field of Classification Search ................. 381/335, 381/351, 352, 345, 336, 333, 160, 349, 350, 381/346, 353; 181/148, 154–156, 198–199
See application file for complete search history.

(56) References Cited

U.S. PATENT DOCUMENTS 2,866,514 A * 12/1958 Weathers .................... 181/151
4,122,302 A * 10/1978 Bobb ......................... 381/335

FOREIGN PATENT DOCUMENTS

| | | |
|---|---|---|
| JP | 63 309094 | 12/1988 |
| JP | 63309094 A | * 12/1988 |
| JP | 6 23395 | 3/1994 |
| JP | 6 284488 | 10/1994 |
| JP | 8 98113 | 4/1996 |
| JP | 9 200884 | 7/1997 |

* cited by examiner

*Primary Examiner*—Devona E Faulk
(74) *Attorney, Agent, or Firm*—Frommer Lawrence & Haug LLP; William S. Frommer; Ellen Marcie Emas

(57) ABSTRACT

In order to divide the inside space of the cabinet into at least two with a speaker being the center, obtain a plurality of emitted sound energies through openings constructed in each divided sphere, and utilize a cabinet of a loudspeaker apparatus as a sound echo box, a partition wall 4 is disposed at a right angle to a baffle board 2 or a front board 7, passing through the center O of a speaker 3 disposed on the baffle board 2 or the front board 7 of the cabinet 6, and divides the inside space of the cabinet 6 into at least two of an upper chamber 11U and a lower chamber 11D, so that sound energies are emitted from openings 8 and 9 which are provided in each chamber of 11D and 11U, respectively.

7 Claims, 10 Drawing Sheets

(Perspective View from A)

SOUNDING DEVICE

TECHNICAL FIELD

This invention relates to a loudspeaker apparatus suitable for use in an electric guitar amplifier, and particularly, to the loudspeaker apparatus capable of being used not only as a speaker cabinet but also as a resonance amplifier box for an electric guitar.

BACKGROUND ART

Conventionally, with respect to an electric guitar amplifier (hereinafter referred to as a guitar amplifier), different types of cabinets (enclosures) are used depending on the music to be played.

Specifically, a cabinet having a structure of open back box baffle, sealed box baffle, bass-reflex baffle, or the like is used, and since high operating efficiency of a speaker is obtained and sound projects forward out of the speaker, the open back baffle is suitable for reproducing such vivid and energetic sound as American sound. On the other hand, in this construction since sound is insufficiently reproduced in bass range, the low-frequency component correction is conventionally performed by an equalizer in an amplifier side.

Then, the sealed box baffle is mainly used for reproducing loud sound such as a live music play, since the operating efficiency of a speaker is low, and in most cases four sets of speakers of 30 cm in diameter are accommodated within the cabinet to be used by a number of musicians producing such hard sound as British rock.

Further, 99% of all the vented baffles (bass reflex) are used in a bass guitar amplifier and the insufficient sound reproduction in bass range is augmented by a bass reflex. The cabinet of bass reflex type is not used as a guitar amplifier. The reason is assumed that the quality of sound in bass range reproduced by a duct may be far from that reproduced by a speaker.

Therefore, either open back box baffle or sealed box baffle is mostly used for a guitar amplifier.

Further, there is conventionally used a cabinet for a guitar amplifier, which is made of thick wood boards of 18 mm to 25 mm in thickness; in order to avoid scratches on the surface and to restrain an unnecessary resonance, the outside surface of which is overlaid with a felt or various kinds of leather (vinyl-leather) similarly to the case of a conventional loudspeaker apparatus; corner sections of which are reinforced by metal fittings; and in which a speaker and an amplifier circuit are accommodated.

When the sound is emitted through the above mentioned conventional guitar amplifier, there arise a problem in which such acoustic expression as variety of timbre, sound echoes and multi-directional emission of sound originally produced by the musical instrument, for example, an electric guitar are not sufficiently reproduced.

When the above-described problem is further studied in relation to a guitar (what is called an acoustic guitar) and an electric guitar, the acoustic guitar has a body of a wooden box which functions as a resonance diffusing box, and emits fundamental tones generated by the strings in simple harmonic motions and also from the body in multiple directions, emits sound of multiple phases having inherent timbre including various tone ratio, in which harmonic tones whose ratio is determined depending on the shape of the body are contained as the containing ratio of harmonics tone attenuates with a lapse of time, thereby producing sound inherent to a guitar.

On the other hand, since the electric guitar emits sound through a guitar amplifier by converting the vibration of metal strings into electric signals using an electro-acoustic transducer (pick-up) which is placed under the strings on a resonance body of either resonance box or single board, it is difficult to achieve a sound expression inherent to a musical instrument such as variety of timbre, sound echoes and multi-directional emissions of sound, which are produced by resonance diffusing box such as the acoustic guitar.

In other words, since the vibration of metal strings is picked up at a single point and is emitted in a single direction as a sound energy, a sound source is considered to be completely different from that of an acoustic guitar, in which every part of the body emits sound in multiple directions.

Even if an electric guitar is equipped with a resonance box, the sound generated by the resonance box is considerably low in comparison to magnified sound from a guitar amplifier, and therefore it is considered to be impossible to reproduce all of its inherent expression.

However, since the strings of the electric guitar are influenced by composite harmonic tones which are generated by a resonance board, electric signals converted from the vibration of metal strings carry contents of various harmonic tones and sound echoes close to a live musical instrument.

Accordingly, the object of the present invention is to provide a loudspeaker apparatus, which functions as a guitar amplifier (including a speaker, a cabinet and an amplifier), capable of reproducing sound similar to that of a live musical instrument, in which electro-acoustic signals electrically converted from vibration by a pick-up become sound with intrinsic features of an acoustic guitar, such as various harmonic tones, echoes and multi-directional emissions of acoustic energy.

As described above, a cabinet used for the guitar amplifier is mostly of either open back box baffle, sealed box baffle or bass reflex and is made of non-resonant solid thick wood boards; and since sound energies are emitted in concentric waves from the center of a point where the speaker is attached, there is no sound emission similar to those emitted from the body of an acoustic guitar, and in addition, a high frequency range is restrained by a felt or the like overlaid on the surface of the cabinet and sound signals are emitted as a reproduction sound close to electric signals, which contains less harmonic tones. Accordingly, the second object of the present invention is to improve a cabinet (synonymous with an enclosure, a speaker box, a casing or a housing) so as to obtain a loudspeaker apparatus, in which multi-directional emission of sound from the cabinet is increased, sound in a high frequency range is not to be absorbed, the capability of reproducing sound in a high frequency range (harmonic tones) is enhanced and sound energies of middle and low frequency range is capable of being emitted in multiple directions.

DISCLOSURE OF THE INVENTION

A first aspect of the present invention is a loudspeaker apparatus 1, in which a partition wall 4 provided at a right angle to approximately the center of a speaker 3 which is provided on a baffle board 2 divides the baffle board 2 into at least two regions, so that sound energies are obtained from at least two divided regions.

A second aspect of the present invention is a loudspeaker apparatus 1, in which a partition wall 4 provided at a right angle to approximately the center of a speaker 3 that is installed on a front board 7 of a cabinet 6 divides the inside space of the cabinet 6 into at least two to emit sound in middle and low frequency range from one of the divided space in the cabinet and to emit sound in middle and high frequency range from the other divided space in the cabinet.

A third aspect of the present invention is a loudspeaker apparatus according to the second aspect of the present invention, in which a first opening 8 is provided on a bottom surface of one of the divided space in the cabinet, a second opening 9 is provided on a rear board of the other divided space in the cabinet, and the bottom surface on the side of the front board 7 is inclined at a predetermined angle.

A fourth aspect of the present invention is a loudspeaker apparatus according to the second or third aspect of the present invention, in which the partition wall 4 and the outside of the cabinet 6 are formed of wood boards and the surface thereof is mirror-finished with coating material such as lacquer or the like, whereby a whole cabinet is made to be a resonance amplifier body.

A fifth aspect of the present invention is a loudspeaker apparatus according to the third or the fourth aspect of the present invention, in which the predetermined angle of inclination of the cabinet 6 is set to 15°.

A sixth aspect of the present invention is a loudspeaker apparatus according to any one of the third to fifth aspects of the present invention, in which the first opening 8 on the bottom surface of the cabinet 6 is bored approximately right beneath a speaker 3 in the shape of trapezoid, and the area of the trapezoid-shaped first opening is selected to be 80% of the horizontal cross section of a diaphragm 10 in the speaker 3.

According to the loudspeaker apparatus of the first through the sixth aspects of the present invention, there is obtained the loudspeaker apparatus, in which through a plurality of added sound outlets sound is amplified to be emitted in multiple directions from the cabinet accommodating a speaker, so that sound energies of different phases which contains various harmonic tones similar to a musical instrument are emitted, efficiency with respect to the emission is improved, and since high-frequency components are reflected on the surface of the cabinet and the cabinet is light-weighted so as to function as a resonance body and to enhance the efficiency in reproducing high frequency waves, there is reproduced sound emitted in multiple directions with a variety of timbre and sound echoes that is close to that of a musical instrument such as an acoustic guitar.

BEST MODE FOR CARRYING OUT THE INVENTION

Hereinafter, a structural principle of an embodiment of the present invention will be described with reference to FIGS. 1A and 1B, and FIGS. 2A to 2C.

Figure 1B:
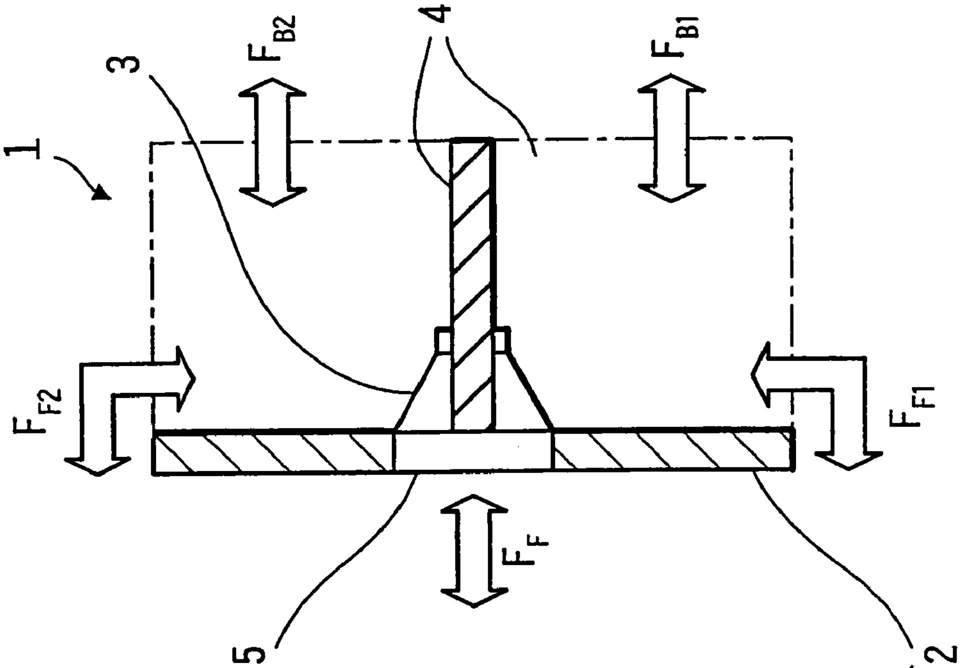
FIGS. 1A and 1B are a front view and a fragmentary cross-sectional side view, showing a loudspeaker apparatus according to an embodiment of the present invention.
Figure 1A:
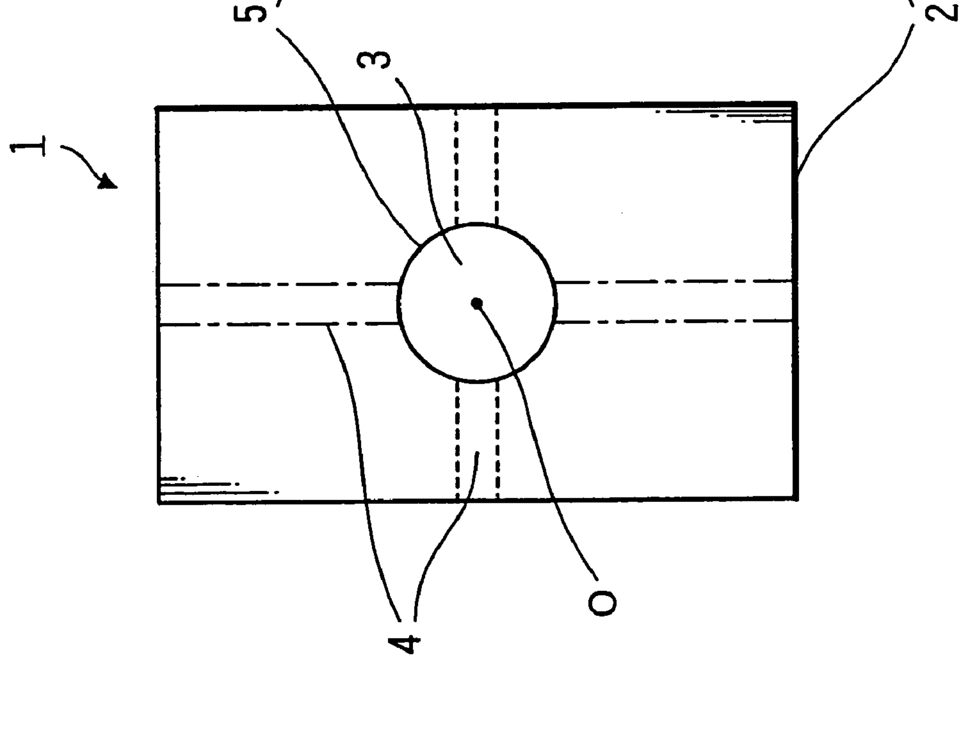
Figure 2A:
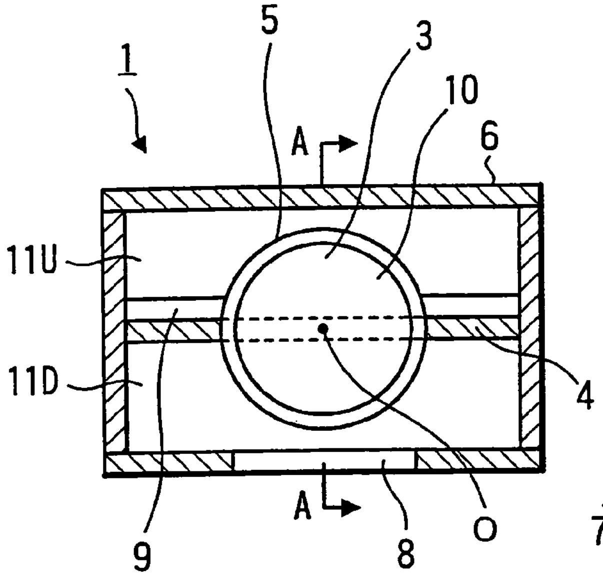
FIGS. 2A to 2C are a fragmentary cross-sectional front view, a fragmentary cross-sectional side view and an equivalent circuit diagram, showing a loudspeaker apparatus according to an embodiment of the present invention.
Figure 2B:
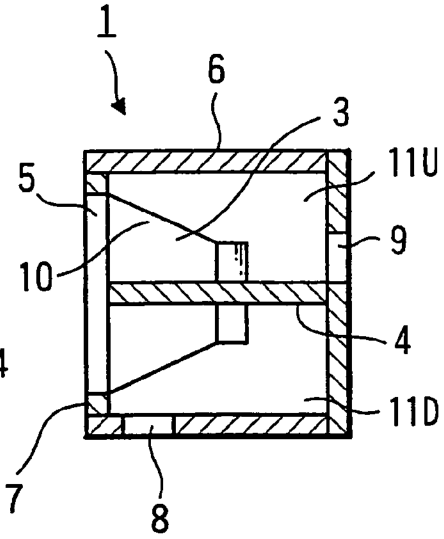
Figure 2C:
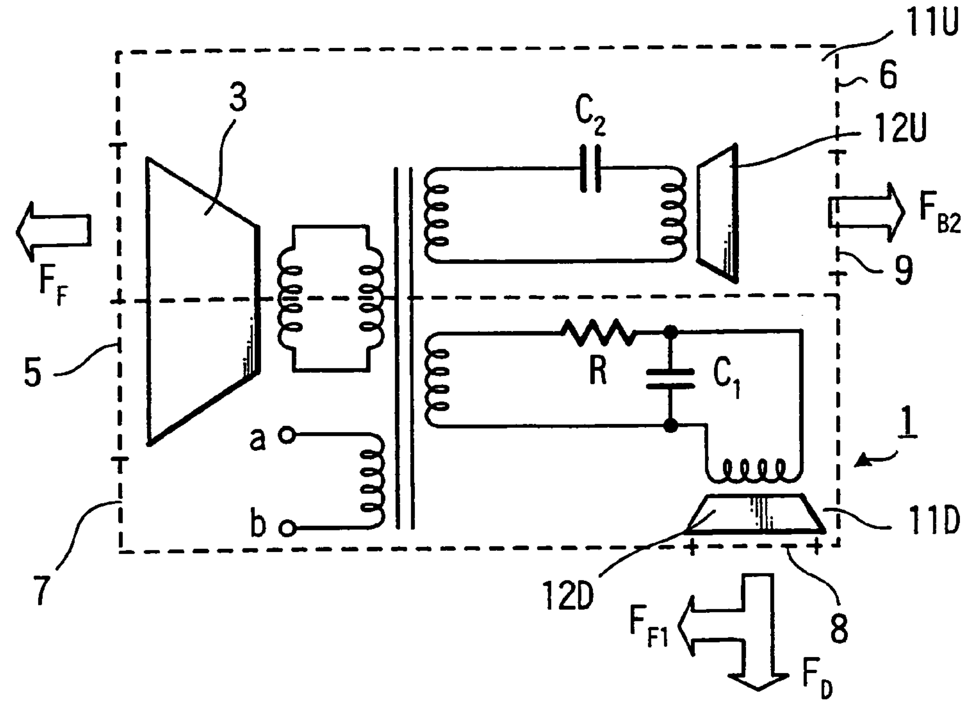

FIGS. 1A and 1B are a front view and a cross-sectional side view showing a state in which a speaker of a loudspeaker apparatus 1 according to the present invention is installed on a baffle board; and FIG. 2A is a fragmentary cross-sectional front view of the loudspeaker apparatus of the present invention, FIG. 2B is a cross-sectional perspective view taken by A-A in FIG. 2A, and FIG. 2C is an equivalent circuit diagram of the loudspeaker apparatus according to the present invention.

In the loudspeaker apparatus shown in FIG. 1, a speaker 3 is fixed to an opening 5, which has the diameter corresponding to that of the speaker 3 and is bored on roughly the center of an approximately rectangular finite baffle board 2, such that the speaker 3 opposites to the opening 5; and further, a partition wall 4 is fixed at a right angle to the vertical plane of the baffle board 2 with the partition wall passing through the center O of the opening 5 or the diaphragm 10 of the speaker 3 to be parallel with the short side direction of the rectangular baffle board 2, so that the partition wall 4 divides the baffle board 2 into at least two regions, that is, upper and lower regions.

When the speaker 3 is actuated under the above-described condition, in addition to the concentric emission of sound energy from the opening 5 of the speaker 3, at least, forward and backward emissions of sound energies $F_{F1}$ and $F_{B1}$ from the lower region of the baffle board 2 under the partition wall 4 and forward and backward emissions of sound energies $F_{F2}$ and $F_{B2}$ from the upper region of the baffle board 2 above the partition wall 4 are obtained.

Although in the above explanation the rectangular baffle board 2 is divided into two regions of upper and lower, when the partition wall 4 is fixed to be parallel with the long side of the baffle board 2 at a right angle to the vertical plane of the baffle board 2 with the partition wall passing through the center O of the opening 5 or the speaker 3, as shown by the virtual chain lines, so that the baffle board 2 is divided into two regions of left and right about the speaker 3, then in addition to forward emission of sound energy $F_F$ from the opening 5 of the speaker 3, there are obtained forward and backward emissions of sound energies by way of the left side end and the top and bottom ends from the left region of the baffle board 2 divided by the partition wall 4 and emissions of sound energies from the right region divided by the partition wall 4.

Obviously, when the above mentioned two partition walls 4 and 4 are provided crosswise, that is, horizontally and vertically to divide the baffle board 2 into four regions, sound emitted from a single speaker can increase twice as much in comparison to a case when no partition wall is installed.

As shown in FIGS. 2A and 2B, the loudspeaker apparatus 1 has an oblong-shaped cabinet 6 like an conventional guitar amplifier, in which the opening 5 is bored on the center of a front board 7 which functions as a baffle board with the speaker 3 being fixed in the position opposite to the opening 5; and the partition wall 4 is fixed to be parallel with top and bottom boards of the cabinet at a right angle to the vertical surfaces of the front board 7 and a rear board passing through the center O of the speaker 3, thereby dividing the cabinet to form an upper chamber 11U and a lower chamber 11D.

Obviously, the portion of the partition wall 4, where the speaker 3 is engaged, is carved to fit to the form of the speaker 3 such as a frame thereof so that a gap is not created between the partition wall and the outer appearance of the speaker as much as possible.

A first opening 8 is bored on the bottom board of the lower chamber 11D right beneath the speaker 3 and the rear board is sealed hermetically. A groove-shaped second opening 9 is bored on the rear board of the upper chamber 11U along the partition wall 4 and its top board is sealed hermetically, and the upper chamber 11U and the lower chamber 11D are constructed to have approximately the same cubic volume.

When the speaker 3 in the loudspeaker apparatus 1 as constructed above is actuated by inputting predetermined sound signals to terminals a and b, the operation can be described by an equivalent circuit shown in FIG. 2C.

In FIG. 2C, when the concentric sound energy at a predetermined time and frequency, which is emitted forward through the opening 5 of the front board 7 constituting a baffle board of the cabinet 6, is $F_F$=fE, the sound energy $F_D$ emitted downward from the first opening 8 of the lower chamber 11D is reflected on a floor to be a forward sound energy $F_{F1}$ with the front board 7 of the cabinet 6 being lifted up at a predetermined angle, and this sound energy $F_{F1}$ and the sound energy $F_{B2}$ emitted backward from the second opening 9 on the rear board of the upper chamber 11U are both one half of the total sound energy fE emitted from the speaker 3 carrying a reverse phase and are expressed as $F_{F1}=F_{B2}=-fE/2$.

If those energies emitted from the first and second openings carry the same phase as that of sound energy $F_F$=fE from the front, those energies are expressed as $fE+|-fE/2|=1.5fE$. If they carry a reverse phase, the expression becomes $fE+(-fE/2)=0.5fE$. In case of delayed phase, they become a sum or subtraction wave, since they each fall into the range of $1.5fE>X>0.5fE$, in average, it is assumed that the sound energy $X=1.0fE$ is emitted from two virtual active speakers 12D and 12U through the first and second openings 8 and 9.

In the present invention, the first opening 8 provided in the lower chamber 11D of the cabinet 6 has different functions from a conventional bass reflex, which reverses a phase of backward sound energy by utilizing resonance at certain narrow band frequencies and emits the backward sound energy toward forward direction; and in this invention the lower chamber 11D including the first opening 8 as a whole are made to be a resonance amplifier body, in which energy larger than the original live sound of a musical instrument (an electric guitar) which is generated by the speaker 3, that is one half fE/2 of the total energy fE in this case, is reflected on the floor constituting infinite baffle to be emitted forward and the sound emitted forward from the speaker 3 is augmented.

When the quality of sound which is emitted through the above mentioned first opening 8 in the lower chamber 11D is studied, although the sound reproduced by the speaker 3 in the cabinet 6 originally contains all frequencies which the speaker 3 can reproduce, through the reflection in a room 15 (refer to FIG. 8) and also through the reflection at a floor 18 (refer to FIG. 8) which constitutes an infinite baffle, a high frequency range is mainly attenuated but the attenuation ratio of a low frequency range, which is the principal feature, is relatively smaller in comparison with the high frequency range. Therefore, components in low and middle frequency range are relatively augmented and emitted.

Especially by making use of the floor 18 as an infinite baffle, the reproduction of a low frequency range (including components of middle frequencies) can achieve the maximum level according to the feature of an infinite baffle, and energies of the low and middle frequency range reflected by the floor 18 are added to the original sound emitted from the front of the speaker 3, thereby producing an effectiveness of magnifying low (including middle) frequency range.

On the other hand, the second opening 9 in the upper chamber 11U does not have an infinite baffle suitable for reproducing a low frequency range, compared to the floor 18 for the lower chamber 11D, and therefore has no such effectiveness as to reinforce mainly a low frequency range.

However, since the upper surface of the partition wall 4 is mirror-finished by coating nitro-cellulose lacquer, a high frequency range is efficiently reflected and emitted from the opening 9 in the upper chamber 11U. Therefore, quality of sound emitted from the second opening 9 in the upper chamber 11U contains relatively larger amounts of high (including middle) frequency components in comparison with quality of sound emitted from the first opening 8 in the lower chamber 11D.

Further, from the second opening 9 in the upper chamber 11U large amounts of emitted sound energy extend around the cabinet 6, because of the position of the opening 9 constructed on the cabinet, and as mentioned above, the mirror-finish in lacquer coating enhances diffused reflection in a high frequency range so as to obtain sound including various phases emitted in multiple directions similar to those originally emitted by a musical instrument.

FIG. 2C is an equivalent circuit diagram of an electrical speaker showing the above described phenomena. Since the values of circuit constant R, C1 and C2 are determined depending upon dimensions and a shape of the cabinet, required constants can be determined based on the purpose for which a loudspeaker apparatus is used.

Figure 3:
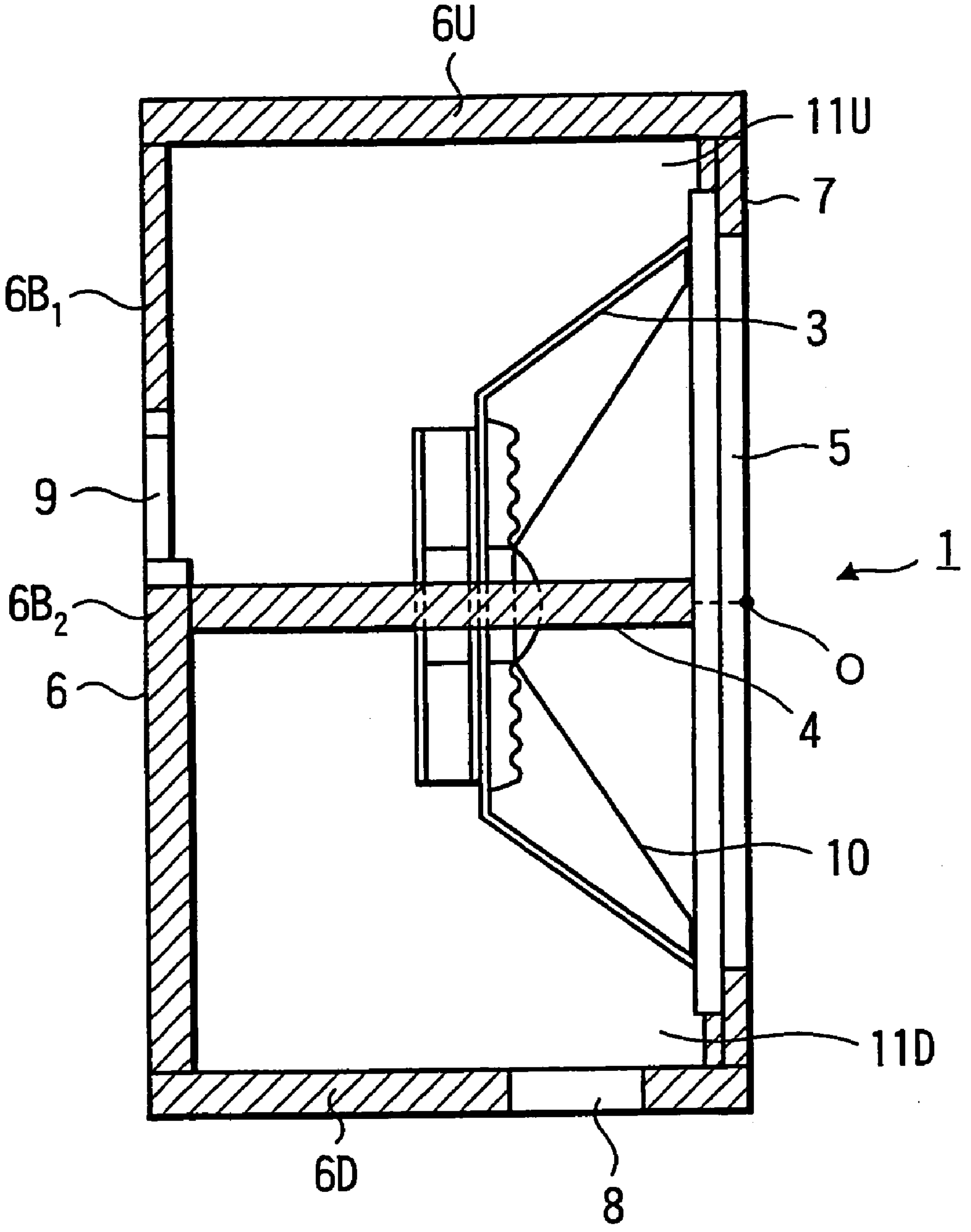
FIG. 3 is a fragmentary cross-sectional side view showing a loudspeaker apparatus according to an embodiment of the present invention.
Figure 4:
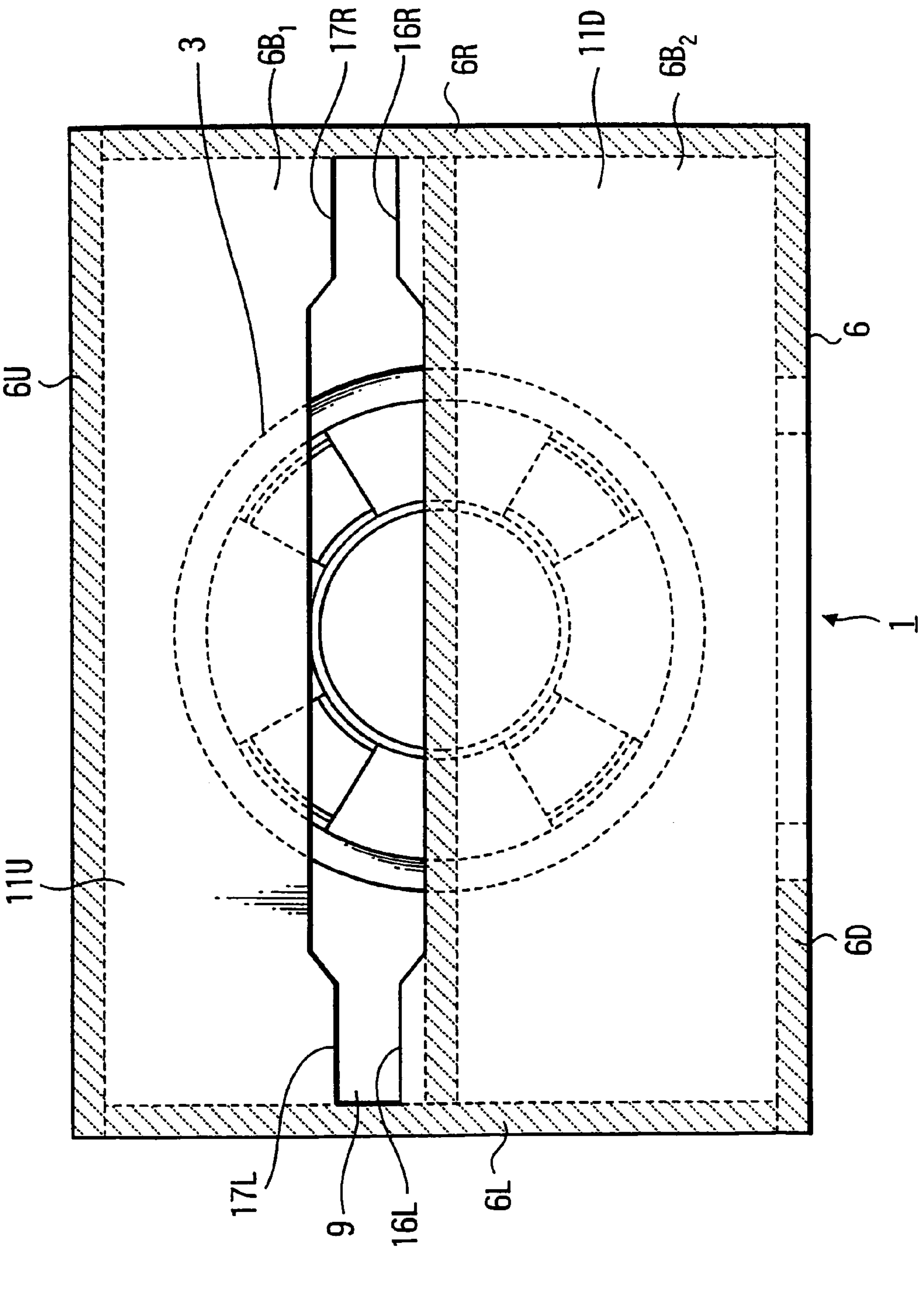
FIG. 4 is a fragmentary cross-sectional bottom view showing a loudspeaker apparatus according to an embodiment of the present invention.
Figure 5:
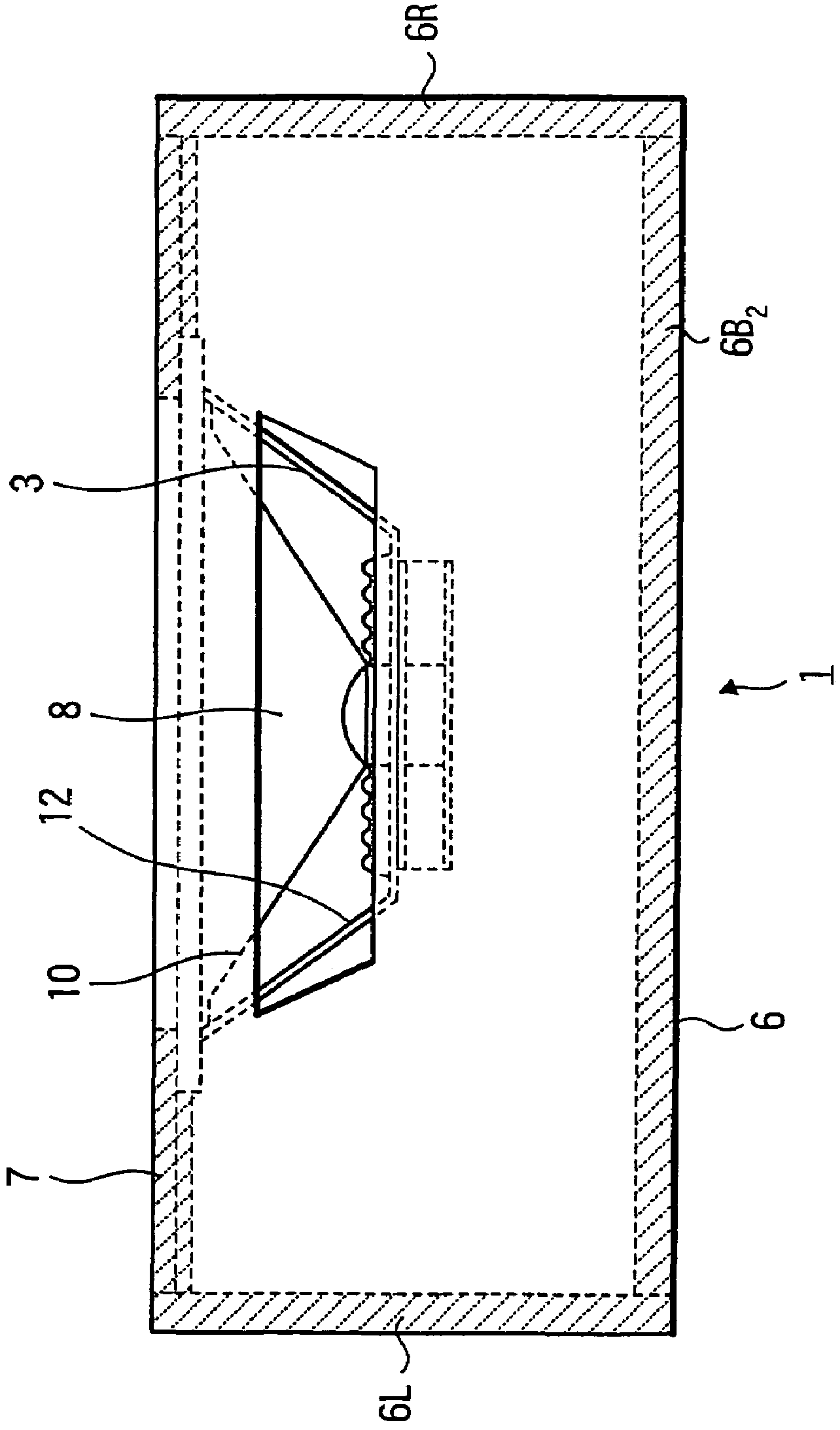
FIG. 5 is a fragmentary cross-sectional plan view showing a partition wall of a loudspeaker apparatus according to an embodiment of the present invention.
Figure 6:
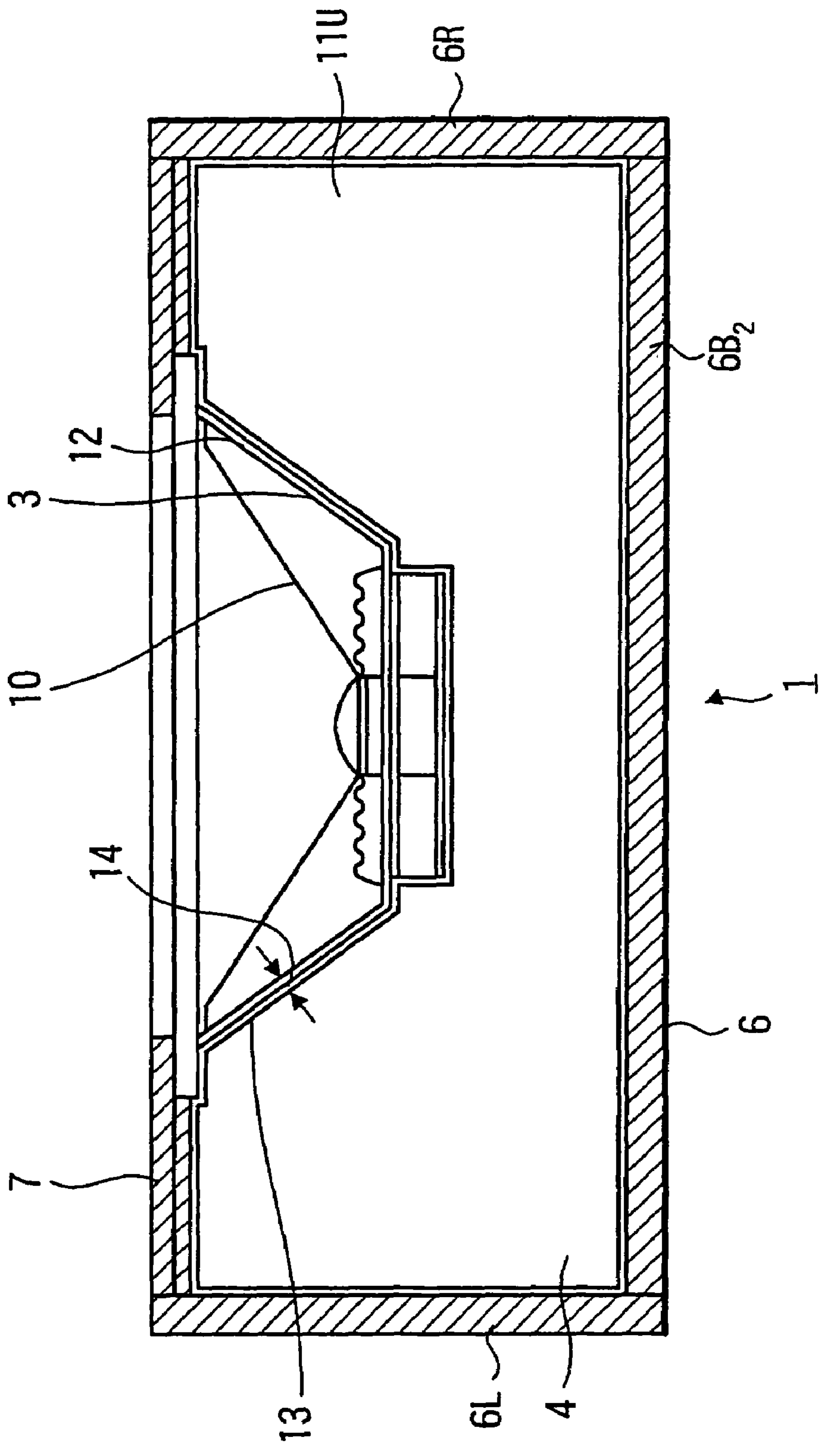
FIG. 6 is a fragmentary cross-sectional rear view of a loudspeaker apparatus according to an embodiment of the present invention.

Next, referring to FIGS. 3 to 6, the construction of the loudspeaker apparatus 1 of a guitar amplifier according to an embodiment of the present invention will be explained in detail. FIG. 3 is a cross-sectional side view of the loudspeaker apparatus 1; FIG. 4 is a fragmentary cross-sectional rear view; FIG. 5 is a fragmentary cross-sectional bottom view; and FIG. 6 is a fragmentary cross-sectional plan view of a partition wall. The same reference numerals are given to those corresponding to the ones in FIG. 2A and 2B.

As shown in FIGS. 3 through 6, a cabinet 6 has oblong parallelepiped shape, in which at the center of a rectangular front board 7 constituting a baffle board a opening 5 having the same diameter as that of a speaker 3 is made to fix such that the speaker 3 is opposite to the opening 5.

The cabinet 6 is formed of rectangular wooden boards of: a top board 6U, a bottom board 6D, left and right side boards 6L, 6R, and first and second rear boards 6$B_1$, 6$B_2$ to be approximately box-shaped.

The material for the cabinet 6 of the present invention is different from a conventional single panel of American larch whose thickness is 18 mm or more, and is a laminated board made of Mercusi pine (Laos pine) of the thickness selected to be about 14 mm. Since the Mercusi laminated board is light-weighted and resonant frequencies thereof are diversified, the cabinet 6 is designed such that, similarly to the body of a violin, the top board 6U, the bottom board 6D, the left and right boards 6L, 6R, the first and second rear boards 6$B_1$, 6$B_2$, and the partition wall 4, which is described later, can adequately bend when vibrating at a maximum amplitude.

Inside the cabinet 6, the partition wall 4 is fixed as shown in FIGS. 3 and 6. This partition wall 4 is fixed through the center O of the opening 5 or the speaker 3 parallel with the top board 6U and the bottom board 6D, and at a right angle to the inside surfaces of the front board 7, the first rear board 6$B_2$ and the left and right side boards 6L, 6R, thereby dividing the inside of the cabinet into two divided space to form an upper chamber 11U and a lower chamber 11D, both of which have approximately the same cubic volumes.

As shown in FIG. 6, a funnel-shaped cutting portion 13 is formed along a frame 12 of the speaker 3 at the front edge of the rectangular partition wall 4. The gap 14 between the cutting portion 13 and the frame 12 of the speaker 3 is constructed to be kept minimum that is not more than 5 mm.

As shown in FIGS. 3 and 4, a first opening 8 is bored on the bottom board 6D of the cabinet 6 right beneath the speaker 3. The first opening 8 is shaped like a funnel-like isosceles trapezoid with the base thereof on the side of the front board 7 and the upside thereof on the side of the rear board 6$B_2$, and has a large area (for example, the base 25 cm×the upside 20 cm×the height 5 cm).

The area of the first opening 8 which has the above-mentioned shape of the isosceles trapezoid is determined depending upon the speaker 3 to be used, and is equivalent to approximately 80% of the horizontal cross-sectional area of the diaphragm 10 of the speaker 3 when the speaker 3 has a diameter of about 30 cm. In the case where the area is larger than the horizontal cross-sectional area of the diaphragm 10 (for example, more than 150%), the emitting velocity of the sound energy becomes slow and, as a result, the energy emitted from the first opening 8 is made to contain high frequency sound components. On the other hand, when the area of the first opening 8 is made smaller to about 50% of the horizontal cross-sectional area of the diaphragm 10, it is verified that the same effect as a bass reflex occurs. As mentioned above, this invention is not for obtaining a function of a bass reflex but for obtaining a throttling effect with respect to the emission of sound energy so that emitting speed becomes faster and the range of resonant frequencies becomes wider.

As shown in FIGS. 3 and 4, the rear surface of the lower chamber 11D under the partition wall 4 is sealed up with the second rear board 6$B_2$, which has the same thickness as the bottom board 6D. In practical use, as shown in FIG. 4, protruding portions 16L, 16R which protrude from the partition wall 4 are formed in the vicinity of the left and right side boards 6L, 6R.

Further, with respect to the upper chamber 11U, as shown in FIGS. 3 and 4, the top board 6U is made of a board having the same thickness as the partition wall 4, and along the partition wall 4 the second opening 9 is bored on the first rear board 6$B_1$.

The second opening 9 is shaped like an approximately rectangle whose width is narrower in the vicinity of the left and right side boards 6L, 6R and wider at the center. In order to obtain the second opening 9, protrusions 17L, 17R are formed opposing to 16L, 16R at left and right positions at the bottom edge of a rectangular board which is slightly thinner than the rear board 6$B_2$, and the sound emitting energy of approximately 1.0fE, which is obtained in the upper chamber 11U, is emitted through this second opening 9. The reason for providing the above described shape, which is narrower in the vicinity of the left and right side boards 6L, 6R and wider at the center when the cabinet 6 is seen from the rear, is that the emitted sound energy $F_{B2}$ from the left and right side boards 6L, 6R to the second opening 9 becomes less in the center of the speaker 3 due to the magnet and the bottom yoke; and that the throttling effect of the emitting sound energy $F_{B2}$ increases in the vicinity of the left and right side boards 6L, 6R.

In addition, the cabinet 6 is mirror-finished by coating nitro-cellulose lacquer on the outside surfaces of the top board 6U, the left and right side boards 6L, 6R and the bottom board 6D, on the upper surface of the partition wall 4 (the side of the upper chamber 11U), and on the walls inside the upper chamber 11U, so that similar to the body of a violin high frequency sound which extends around the cabinet 6 is made to reflect, harmonic tones can be reproduced, and the capability of reproducing a high frequency range is made to be improved.

Moreover, a predetermined roundness R is provided on the periphery of the first and second openings, the top board 6U, the bottom board 6D and the left and right side boards 6L, 6R, so that the effect of the diffused reflection with respect to the emitted sound energy can be smoothed.

Figure 7:
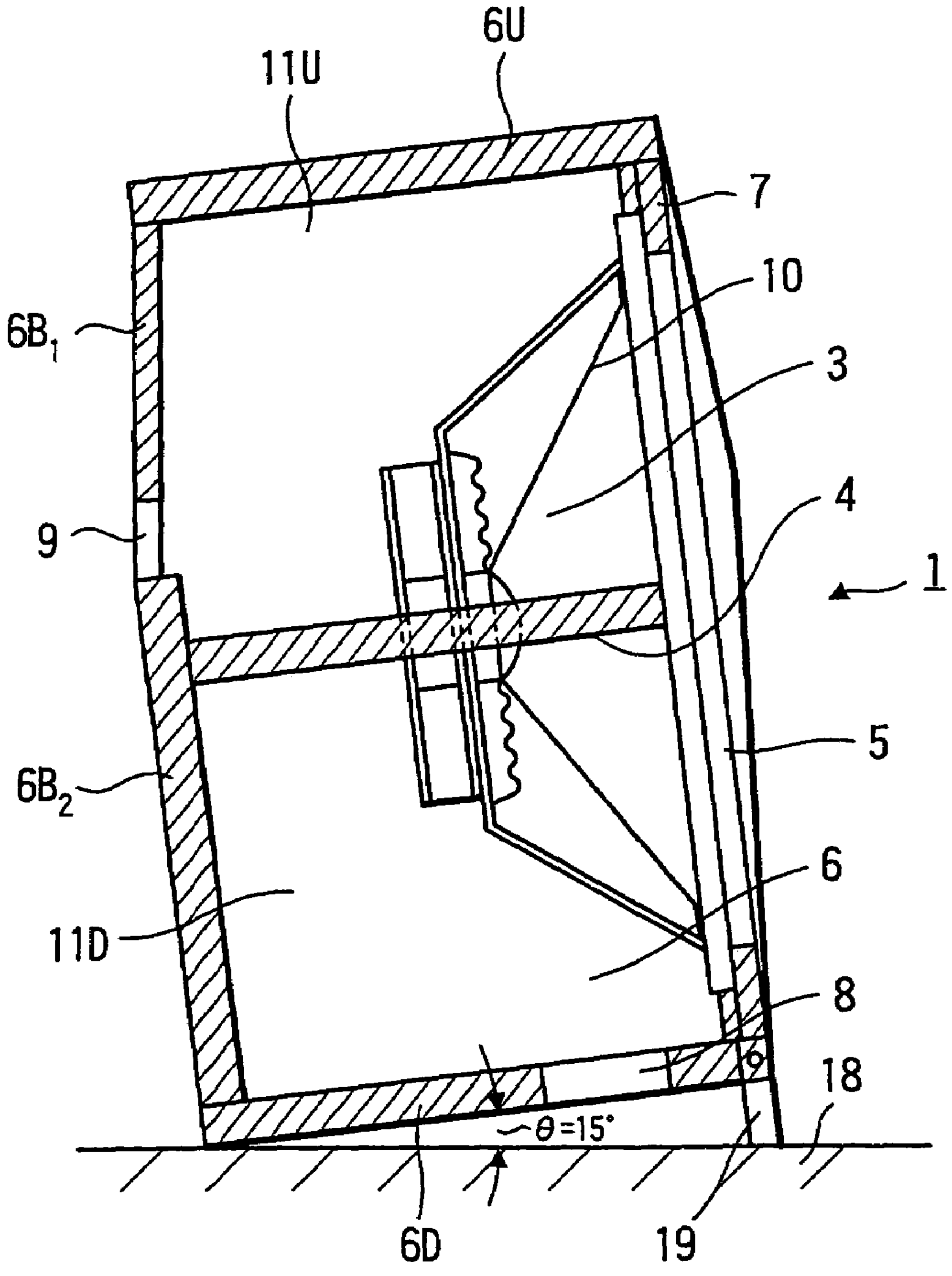
FIG. 7 is a fragmentary cross-sectional side view of a loudspeaker apparatus according to an embodiment of the present invention.
Figure 8:
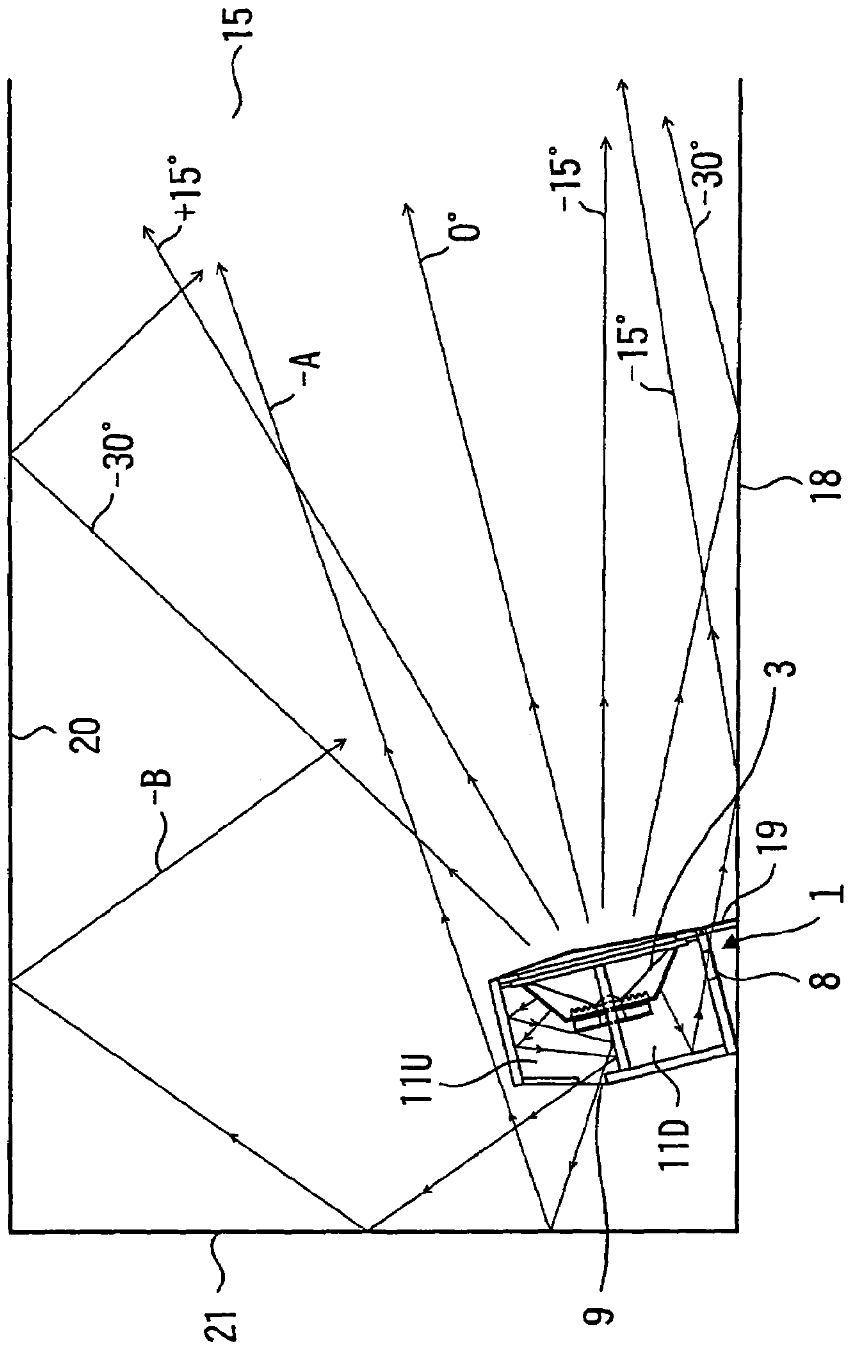
FIG. 8 is a diagram for explaining a state in which sound is emitted from a loudspeaker apparatus according to an embodiment of the present invention.

Next, referring to FIGS. 7 and 8, a loudspeaker apparatus according to an embodiment of the present invention will be explained in detail. FIG. 7 is a cross-sectional side view showing the loudspeaker apparatus which is being operated. FIG. 8 is a schematic diagram for explaining a state in which sound wave is emitted.

The loudspeaker apparatus 1 shown in FIG. 7 is equipped with an folding leg 19 at the front part of the bottom board 6D of the cabinet 6 and the length thereof is selected to obtain an angle of θ=15° between the bottom board 6D of the cabinet 6 and the floor 18 when the leg is unfolded. In addition, length of the short sides of the top board 6U and that of the bottom board 6D of the cabinet 6 are different so that the first rear board 6$B_1$ becomes unparallel to the front board 7, thereby increasing the sound energy with respect to middle and high frequency range emitted from the second opening 9 and extended along the cabinet.

The cubic volume of the upper chamber 11U and the lower chamber 11D in the cabinet 6, which is divided by the partition wall 4, is selected to be approximately equal; and the width (short side of the rectangle shape) of the bottom board 6D is 240 mm and long side thereof is 520 mm in length; the height of the cabinet 6 is 375 mm; and the thickness of Mercusi pine laminated board constituting the cabinet 6 and the partition wall 4 is selected to be 14 mm.

An electro-dynamic type loudspeaker of 30 cm in diameter is selected to be a speaker 3 which is fixed to the front board 7.

The first opening 8 bored on the bottom board 6D is in the shape of an isosceles trapezoid having the dimensions in which the base is 260 mm, the upside is 210 mm, and the height is 50 mm, and the base of the trapezoid is located at 40 mm behind the fixing position of the frame of the speaker 3.

The gap between the frame 12 and the funnel-shaped cutting portion 13 on the partition wall 4, which is formed along the frame 12 of the speaker 3, is set to be 3 mm, and the second opening 9 formed between the first rear board 6$B_1$ and the partition wall 4 is selected to be 372 mm in length and 77 mm in width at the wider portion thereof and 60 mm in length and 37 mm in width at the narrower portions thereof, which are formed in the vicinity of the left and right side boards 6L and 6R.

FIG. 8 shows the state of emitting sound, in which the above described loudspeaker apparatus 1 is disposed at a predetermined position in a predetermined chamber 15 with the leg 19 unfolded and the opening 5 of the speaker 3 at an angle of 15° lifted upward from the floor 18.

When the speaker 3 is actuated in the loudspeaker apparatus 1 shown in FIG. 8, concentric waves of sound energies indicated by arrows of 0° and ±15° are emitted obliquely upward from the opening 5 of the speaker 3 and emission waves of ±30° are reflected by the floor 18 and the ceiling 20. Conventionally, a speaker 3 in a guitar amplifier has frequency characteristics of 160 Hz to 2000 Hz with a low band resonant frequency $f_0$ at about 80 Hz to 100 Hz and a frequency characteristic compensation is performed so as to increase the level of high and low frequency range.

Further, emission wave at an angle of −15° reflected on the floor, which contains harmonic tones in middle and low frequency range of, for example, 1.0fE emission energy is obtained from the first opening 8 in the lower chamber 11D through the reflection on the floor 18. In this case, harmonic tones in a low frequency range, which is emitted from the first opening 8, reaches audiences in front through the reflection on the floor 18 as an infinite baffle.

On the other hand, from the second opening 9 bored on the first rear board 6$B_1$ of the upper chamber 11U, waves in middle and high frequency range having, for example, 1.0fE emission energy reflected on a wall 21 and the ceiling 20—A, waves reflected on the wall and a ceiling—B and the like, which are emitted after reflecting on the top board 6U and the partition wall 4 are emitted to the audiences further in front.

In the present invention, with respect to the phase of sound emitted from the opening 5 and the first and second openings 8 and 9 of the speaker 3, the audience listens to a finalized composite sound wave in which phases such as an synchronous phase, a reverse phase and delayed phases, are emitted and synthesized into a composite sound in a space (chamber 19) and perceives the composite sound waves as the sound generated by a musical instrument (loudspeaker apparatus 1).

According to the present invention, in the loudspeaker apparatus 1 sound energies are emitted from the three openings, which are the front of the speaker 3 and the first and second openings, and in addition, the outside of the cabinet 6 and the partition wall 4 are coated with lacquer or the like and mirror-finished to enhance sound emissions in multiple directions, whereby the loudspeaker apparatus 1 generates sound having rich variation of harmonic tones similar to that of a musical instrument, makes sound waves of various phases efficiently reflect in multiple directions, and as a whole, can be utilized as the loudspeaker apparatus 1 virtually reproducing rich sound field expression similar to that of a musical instrument.

In the above embodiment of the present invention, while the internal space of the cabinet 6 is divided by the partition wall 4 into two of the upper chamber 11U and the lower chamber 11D, the gap 14 is unavoidably made between the partition wall 4 and the frame 12 of the speaker 3. In addition, since there is also some gap between the frame 12 and the diaphragm 10, air can naturally move between the upper chamber 11U and the lower chamber 11D. However as the amplitude of the speaker 3 approaches to its maximum, the less air flows between the upper chamber 11U and the lower chamber 11D, which is similar to the effect of an air curtain, thereby enabling the cabinet to be used as that having upper and lower two divided chambers.

In other words, when larger sound in volume is being produced, the amplitude of the speaker 3 is conventionally large enough to generate dynamic force of moving air (to-and-fro kinetic force with respect to the cabinet 6), which surpasses the force of air moving through the gap 14 between the upper chamber 11U and the lower chamber 11D.

Accordingly, each divided space of the upper and lower chambers is estimated to have 70% to 80% air-tightness under the normal operation, though it is not 100% hermetically sealed.

When the speaker 3 of the above mentioned loudspeaker apparatus in FIG. 7 is actuated and emitted sound is listened to in a predetermined space, 1) there is no considerable disorder with respect to the sound phase;
2) there are more energies emitted from the first and second openings;
3) the emitted air waves contain a comfortable tremor of 3 Hz to 4 Hz;
4) at an ordinary playing position, which is 3 m to 4 m away from the cabinet 6, from low to middle frequency range is definitely compensated and reinforced;
5) a boarded floor is more effective than a carpeted floor.
6) if openings are fully sealed, there is no effectiveness observed; and
7) though the richest sound close to a musical instrument is reproduced at the tilt angle of 15°, deviation up or down from 15° does not change the point where the maximum efficiency is obtained.

Because of the mirror-finish by coating nitro-cellulose lacquer, 8) when the emitted sound waves extend around the cabinet, diffused reflections are caused to generate pleasant echoes of a high frequency range; and
9) in addition, the upper part and surface of the partition wall efficiently reflect and emit a half of the sound energy emitted backward and (depending on the surroundings where the loudspeaker apparatus is placed), thereby forming a sound field which is close to “echoes of a musical instrument”.

As a result, compared to a conventional guitar amplifier which has a felt or leather overlaid on the surface and suppresses the reflection of a high frequency range as much as possible, the loudspeaker apparatus 1 according to the present invention reproduces sufficient sound echoes as a musical instrument.

In the above construction, the internal space of the cabinet 6 is divided into two of either upper and lower chambers or left and right chambers. Then, referring to FIGS. 9 through 11, another embodiment of a loudspeaker apparatus according to the present invention will be explained in detail.

Figure 9A:
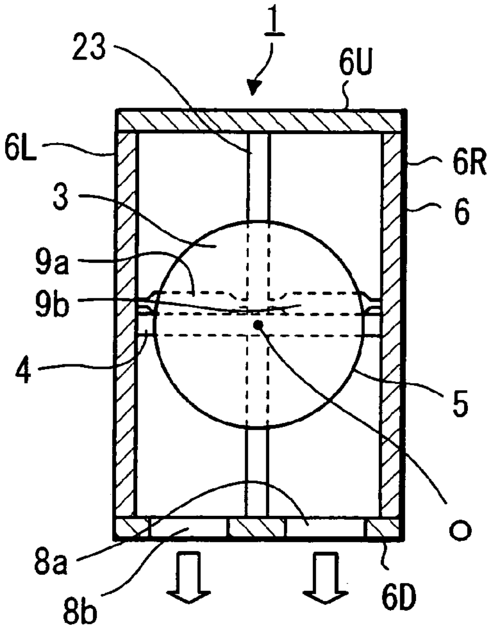
FIGS. 9A and 9B are a fragmentary cross-sectional front view and a fragmentary cross-sectional side view of a loudspeaker apparatus according to another embodiment of the present invention.
Figure 9B:
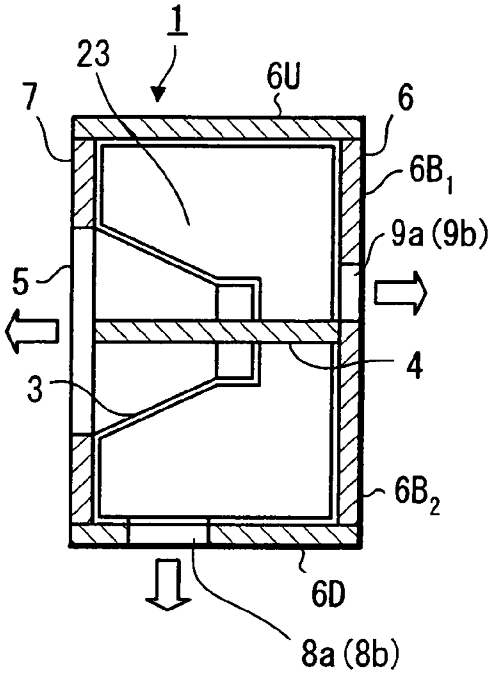

FIGS. 9A and 9B are a fragmentary cross-sectional front view and a fragmentary cross-sectional side view showing an internal space of a cabinet 6 which is divided into four of a first to a fourth chambers by fixing crosswise a first partition wall 4 which is fixed through the center O of a speaker 3 parallel with a top board 6U and a bottom board 6D and at a right angle to inner surfaces of left and right side boards 6L and 6R, and a second partition wall 23 which is also fixed through the center O of the speaker 3 parallel with the left and right side boards 6L and 6R and at a right angle to inner surfaces of the top board 6U and the bottom board 6D, when viewed from the front. Then, second openings 9*a* and 9*b* are bored on the first rear board $6B_1$ in the upper first and second chambers respectively, and first openings 8*a* and 8*b* are bored on the bottom board 6D in the lower third and fourth chambers, respectively. According to the above construction, in addition to a sound emitted from the front of the speaker 3 sound is emitted from the two openings of the rear board $6B_1$ and the two openings of the bottom board 6D and all of those emitted sound signals can be synthesized to be a composite sound in a space.

Figure 10A:
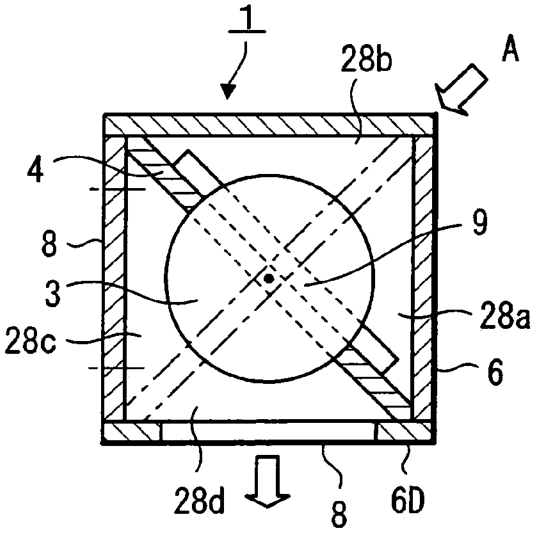
FIGS. 10A and 10B are a fragmentary cross-sectional front view and a fragmentary cross-sectional side view of a loudspeaker apparatus according to further another embodiment of the present invention.
Figure 10B:
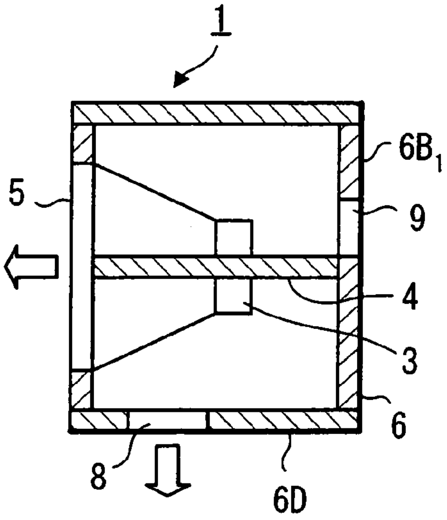

FIG. 10A is a fragmentary cross-sectional front view; and FIG. 10B is a fragmentary cross-sectional view in the direction shown with arrow A in FIG. 10A; and the shape of the cabinet 6 is a regular hexahedron.

In FIGS. 10A and 10B, the inside of the cabinet is diagonally divided by a partition wall 4, as shown in FIG. 10A, to form upper and lower (or left and right) two rectangular-pole shaped space, and first and second openings 8 and 9 are bored on the bottom board 6D and the rear board $6B_1$, respectively. In this case, as shown with virtual lines in FIG. 10A, two partition walls 4 may be disposed crosswise in diagonal directions to divide the cabinet into quarters: a first through a fourth triangular-pole shaped quadrant chambers 28*a* through 28*d*, and, with respect to the third chamber 28*c*, the first opening 8 may be bored on the left side board thereof.

Figure 11A:
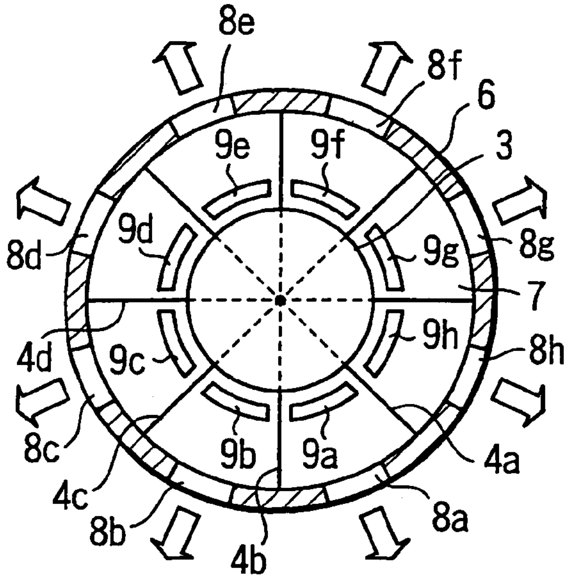
FIGS. 11A and 11B are fragmentary cross-sectional front views of loudspeaker apparatuses according to yet further embodiments of the present invention.

FIG. 11A shows the construction in which a speaker 3 is fixed to a front board 7 of a cylindrical cabinet 6 whose inside space is divided into eight by four partition walls 4*a*, 4*b*, 4*c* and 4*d*, and first openings 8*a* through 8*h* are formed on side walls of respective space and second openings 9*a* through 9*h* are formed on a rear board 6B, thereby emitting sound from 17 outlets in total.

Figure 11B:
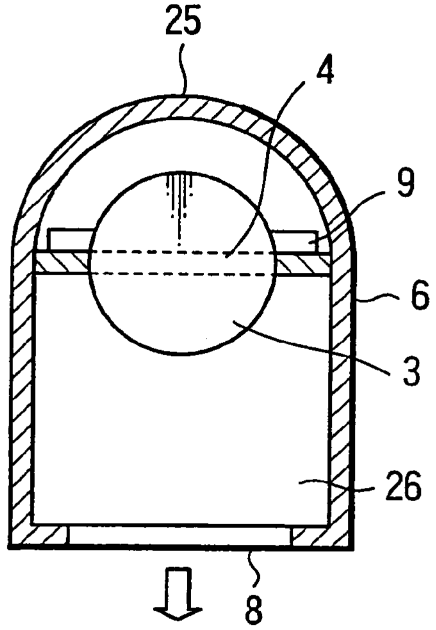

FIG. 11B shows the construction in which a domed cabinet whose inside is divided into upper and lower space at the base of the dome is provided to form the dome portion 25 and the cylindrical portion 26, the cubic volume of which is different to each other.

Although in the above-described construction, a loudspeaker apparatus applied to a guitar amplifier is explained in detail, the present invention can be applied to a speaker box for reproducing a CD and the like to obtain the speaker box having rich sound echoes including sound emissions and the reproduction characteristics of harmonic tones, thereby providing such an affluent musical expression as a concert hall has.

With respect to the shape of the cabinet, the same shape as a musical instrument such as a violin or the like is employed to utilize its own features, which are determined depending on the shape of the cabinet 6, such as producing harmonic tones, emitting sound in multiple directions and sound echoes. In this case a partition wall of the present invention can be correspond to a prop stick of a violin or the like.

According to a loudspeaker apparatus of the present invention, a) the inside space of a speaker can be divided into at least two of either upper and lower, or left and right to emit sound, in which middle and high frequency range and low and middle frequency range are diffused and reinforced, from the divided space;

b) a cabinet is lifted up at an angle of 15° from a floor to emit sound energy in the front direction from a first opening facing the floor, thereby compensating and reinforcing the original sound emitted from the front surface of the speaker;

c) the outside surfaces of a top board and left and right side boards, and the upper surface of a partition wall are mirror-finished by coating nitro-cellulose lacquer, thereby enhancing the reflection efficiency of a high frequency range to cause the reproduction of harmonic tones, and as the result, the timbre inherent to a musical instrument can be reproduced; and d) from an opening provided on a rear board, more sound energies are emitted to a wall behind or the like with a partition wall being utilized as a reflector, thereby reinforcing the reproduction of "a sound field intrinsic to a musical instrument".

INDUSTRIAL APPLICABILITY

According to a loudspeaker apparatus of this invention, sound similar to that of a live musical instrument can be emitted from an electric guitar amplifier (a cabinet for a guitar amplifier), and therefore this loudspeaker apparatus is suitable for use in a speaker apparatus (speaker box) for audio equipment such as a conventional recording and reproducing apparatus and also in a speaker apparatus which includes a speaker within a housing (a casing or an enclosure) of an electronic apparatus such as a radio, a CD player and the like.

DESCRIPTION OF REFERENCE NUMERALS

1 . . . LOUDSPEAKER APPARATUS
2 . . . BAFFLE BOARD
3 . . . SPEAKER
4 . . . PARTITION WALL
5 . . . OPENING
6 . . . CABINET
7 . . . FRONT BOARD
8 . . . FIRST OPENING
9 . . . SECOND OPENING
10 . . . DIAPHRAGM
11U . . . UPPER CHAMBER
11D . . . LOWER CHAMBER

The invention claimed is:

1. A loudspeaker apparatus, in which a partition wall provided at a right angle to a center of a speaker that is installed on a front board of a cabinet divides an inside space of the cabinet into at least two to emit sound in middle and low frequency range from one of the divided space in the cabinet and to emit sound in middle and high frequency range from the other divided space in the cabinet, wherein a first opening is provided on a bottom surface side of said one of divided space in the cabinet and a second opening is provided on a rear board of the other divided space in the cabinet, and the front edge of the bottom board of the cabinet is tilted at a predetermined angle, wherein said first opening on the bottom surface of said cabinet is bored approximately right beneath said speaker and is trapezoid in shape, and the area of the trapezoid-shaped opening is selected to be 80% of the horizontal cross-sectional area of a diaphragm of the speaker.

2. A loudspeaker apparatus according to claim 1, wherein the outside of said cabinet and said partition wall are made of wood and surfaces thereof are mirror-finished by coating lacquer or the like to make the whole cabinet become a resonance amplifier box.

3. A loudspeaker apparatus according to claim 1, wherein the predetermined tilt angle of said cabinet is set to 15°.

4. A loudspeaker apparatus according to claim 1, wherein the outside of said cabinet and said partition wall are made of wood and surfaces thereof are mirror-finished by coating lacquer or the like to make the whole cabinet become a resonance amplifier box.

5. A loudspeaker apparatus according to claim 2, wherein the predetermined tilt angle of said cabinet is set to 15°.

6. A loudspeaker apparatus according to claim 2, wherein said first opening on the bottom surface of said cabinet is bored approximately right beneath said speaker and is trapezoid in shape, and the area of the trapezoid-shaped opening is selected to be 80% of the horizontal cross-sectional area of a diaphragm of the speaker.

7. A loudspeaker apparatus according to claim 3, wherein said first opening on the bottom surface of said cabinet is bored approximately right beneath said speaker and is trapezoid in shape, and the area of the trapezoid-shaped opening is selected to be 80% of the horizontal cross-sectional area of a diaphragm of the speaker.

* * * * *